(12) United States Patent
Correale, Jr.

(10) Patent No.: US 6,833,747 B2
(45) Date of Patent: Dec. 21, 2004

(54) LEVEL TRANSLATOR CIRCUIT FOR USE BETWEEN CIRCUITS HAVING DISTINCT POWER SUPPLIES

(76) Inventor: Anthony Correale, Jr., 4729 Wood Valley Dr., Raleigh, NC (US) 27613

( * ) Notice: Subject to any disclaimer, the term of this patent is extended or adjusted under 35 U.S.C. 154(b) by 0 days.

(21) Appl. No.: 10/396,967

(22) Filed: Mar. 25, 2003

(65) Prior Publication Data

US 2004/0189371 A1 Sep. 30, 2004

(51) Int. Cl.[7] .............................................. H03L 5/00
(52) U.S. Cl. ........................ 327/333; 327/390; 326/81; 326/68
(58) Field of Search ................................ 327/333, 390, 327/427, 108, 589, 112, 581; 326/68, 80, 81; 363/60

(56) References Cited

U.S. PATENT DOCUMENTS

| | | | | |
|---|---|---|---|---|
| 5,280,420 A | * | 1/1994 | Rapp ............................ | 363/60 |
| 5,382,838 A | | 1/1995 | Sasaki et al. ................ | 327/108 |
| 5,406,140 A | | 4/1995 | Wert et al. .................... | 326/68 |
| 5,650,742 A | * | 7/1997 | Hirano ......................... | 327/333 |
| 6,255,888 B1 | * | 7/2001 | Satomi ......................... | 327/333 |
| 6,259,299 B1 | | 7/2001 | Ryu ............................. | 327/333 |

* cited by examiner

*Primary Examiner*—Long Nguyen
(74) *Attorney, Agent, or Firm*—Scott W. Reid; Sawyer Law Group, LLP

(57) ABSTRACT

A level translator circuit for use between a lower voltage potential circuit and a higher voltage potential circuit is disclosed. The translator circuit comprises a first transistor coupled to the lower voltage potential circuit and a bootstrap mechanism coupled to the first transistor. The circuit includes a second transistor coupled to the first transistor, a higher voltage potential and the higher voltage potential circuit, and a third transistor coupled to the higher voltage potential circuit, the higher voltage potential and the second transistor. Finally, the circuit includes a fourth transistor coupled to the higher voltage potential circuit, the third transistor and the lower voltage potential circuit. The bootstrap mechanism allows for the dynamic modulation of the first transistor to maximize translation speed and to minimize power consumption. A level translator circuit in accordance with the present invention utilizes a bootstrap mechanism in the gate of the input transistor to allow translating between a low voltage potential to a high voltage potential to be performed more efficiently.

5 Claims, 6 Drawing Sheets

100

LEVEL TRANSLATOR CIRCUIT FOR USE BETWEEN CIRCUITS HAVING DISTINCT POWER SUPPLIES

FIELD OF THE INVENTION

The present invention relates generally to a level translator circuit and more particularly to a level translator circuit for use between circuits having distinct power supplies.

BACKGROUND OF THE INVENTION

Circuits for voltage level translation are utilized in a variety of applications. Level translator circuits are employed to allow circuits operating at different power supply potentials to communicate with one another. Typically, the area, power and performance of the translator circuit are critical to the operations of each of the different circuits.

FIG. 1 is a simple block diagram of a level translator system 10. The system 10 includes a level translator circuit 12 coupled between circuits 14 and 16. In this embodiment, Vddl circuit 14 is coupled to a lower voltage supply and Vddh circuit 16 is coupled to a higher voltage supply. Level translation is required only when a circuit on a lower voltage supply interfaces with one on a higher voltage supply. The level translates due to the voltage difference between Vddl circuit 14 and Vddh circuit 16, causing a resulting leakage current.

It is important that a level translator circuit operate efficiently, utilize minimal power, and translate from one voltage supply potential to another as quickly as possible. The speed and performance of conventional translator circuits are typically adversely affected by contention between transistors within the circuit during the translation. For a more detailed description of this issue, refer now to the following discussion in conjunction with the accompanying figures.

FIG. 2 illustrates a first embodiment of a conventional level translator circuit 100 coupled between distinct power supplies. In this circuit, cross-coupled pfet transistors 102 and 106 connected to the Vddh circuit 16' are used in conjunction with pull-down nfet transistors 104 and nfet transistor 108 and an inverter 110 which is connected to the Vddl supply. The circuit 100 operates as follows: For propagation of a logical '0' from the Vddl circuit cloud 14', transistor 104 is off, the inverter 110 produces a logical '1' at node-2 in the form of Vddl volts, which then turns on nfet transistor 108, driving node-Z to a logical '0', which in turn causes pfet transistor 102 to turn on, thereby raising node-1 to Vddh volts, which in turn causes pfet transistor 106 to turn off. Since the gate of pfet transistor 106 is at Vddh and the source of pfet transistor 106 is also at Vddh, there is no leakage. This circuit is non-inverting.

For propagation of a logical '1' from the Vddl circuit cloud 14', nfet transistor 104 is on, resulting in node-1 being drawn toward a logical '0'. The inverter 110 produces a logical '0' at node-2 in the form of 0 volts, which results in nfet transistor 108 turning off. Since node-1 is being drawn to 0 volts, pfet transistor 106 is now on, driving node-Z to a logical '1' in the form of Vddh volts, which in turn reinforces the node-1 potential of '0' by turning off pfet transistor 102.

FIG. 3 illustrates a second embodiment of a conventional level translator circuit 200 coupled between distinct power supplies. In this configuration, the inverter is eliminated and the source of nfet transistor 204 is connected to the gate input of the nfet transistor 208, which is connected to the output of the Vddl circuit 14". Also, the gate of nfet transistor 204 is connected directly to the Vddl supply. This circuit 200 operates as follows: For propagation of a logical '0' from the Vddl circuit cloud 14", nfet transistor 204 is on and nfet transistor 208 is off, thereby relinquishing control of node-Z. Since nfet transistor 204 is on, node-1 is now at 0-volts turning on pfet transistor 206, raising node-Z to Vddh volts, which in turn shuts off pfet transistor 202, which reinforces the node-1 level of 0-volts. Also note that this circuit configuration is inverting.

For propagation of a logical '1' from the Vddl circuit, nfet transistor 204 is on until the voltage at node-1 can rise to Vddl-Vtn. This voltage rise begins to shut off pfet transistor 206. Nfet transistor 208 is now active and pulling node-Z low, which in turn activates pfet transistor 202, which raises the node-1 potential to Vddh, which in turn shuts off the leakage from pfet transistor 206.

In each of these embodiments, a basic problem is that there is a contention between nfet transistors 104 or 204 and pfet transistors 102 or 202 when translation takes place. When translation is initiated, these transistors are fighting each other for control of the output. In addition, due to sizing constraints, the nfet transistors 104 or 204 must be stronger than the pfet transistors 102 or 202. In so doing, there is poor rising low-to-high performance in the output node.

Accordingly, the contention between nfet transistors 104 or 204 and pfet transistors 102 or 202 affects the speed and performance of the level translator 100 or 200. Accordingly, what is desired is a level translator circuit that minimizes the time that these transistors are in contention so as to maximize the performance of the circuit and minimize its power dissipation. The circuit should be cost effective and have performance characteristics equal to or greater than conventional circuits. The circuits should also be easily implemented utilizing existing processes. The present invention addresses such a need.

SUMMARY OF THE INVENTION

A level translator circuit for use between a lower voltage potential circuit and a higher voltage potential circuit is disclosed. The translator circuit comprises a first transistor coupled to the lower voltage potential circuit and a bootstrap mechanism coupled to the first transistor. The circuit includes a second transistor coupled to the first transistor, a higher voltage potential and the higher voltage potential circuit, and a third transistor coupled to the higher voltage potential circuit, the higher voltage potential and the second transistor. Finally, the circuit includes a fourth transistor coupled to the higher voltage potential circuit, the third transistor and the lower voltage potential circuit. The bootstrap mechanism allows for the dynamic modulation of the first transistor to maximize translation speed and to minimize power consumption. A level translator circuit in accordance with the present invention utilizes a bootstrap mechanism in the gate of the input transistor to allow translating between a low voltage potential to a high voltage potential to be performed more efficiently.

DETAILED DESCRIPTION

The present invention relates generally to a level translator circuit and more particularly to a level translator circuit for use between circuits having distinct power supplies. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

What the applicant has determined is that, by providing a bootstrap mechanism on the input of the circuit, the output can respond more rapidly to the appropriate level while consuming lower power than when utilizing conventional level translator circuits. For a more detailed description of this feature, refer now to the following discussion in conjunction with the accompanying figures.

Figure 4:
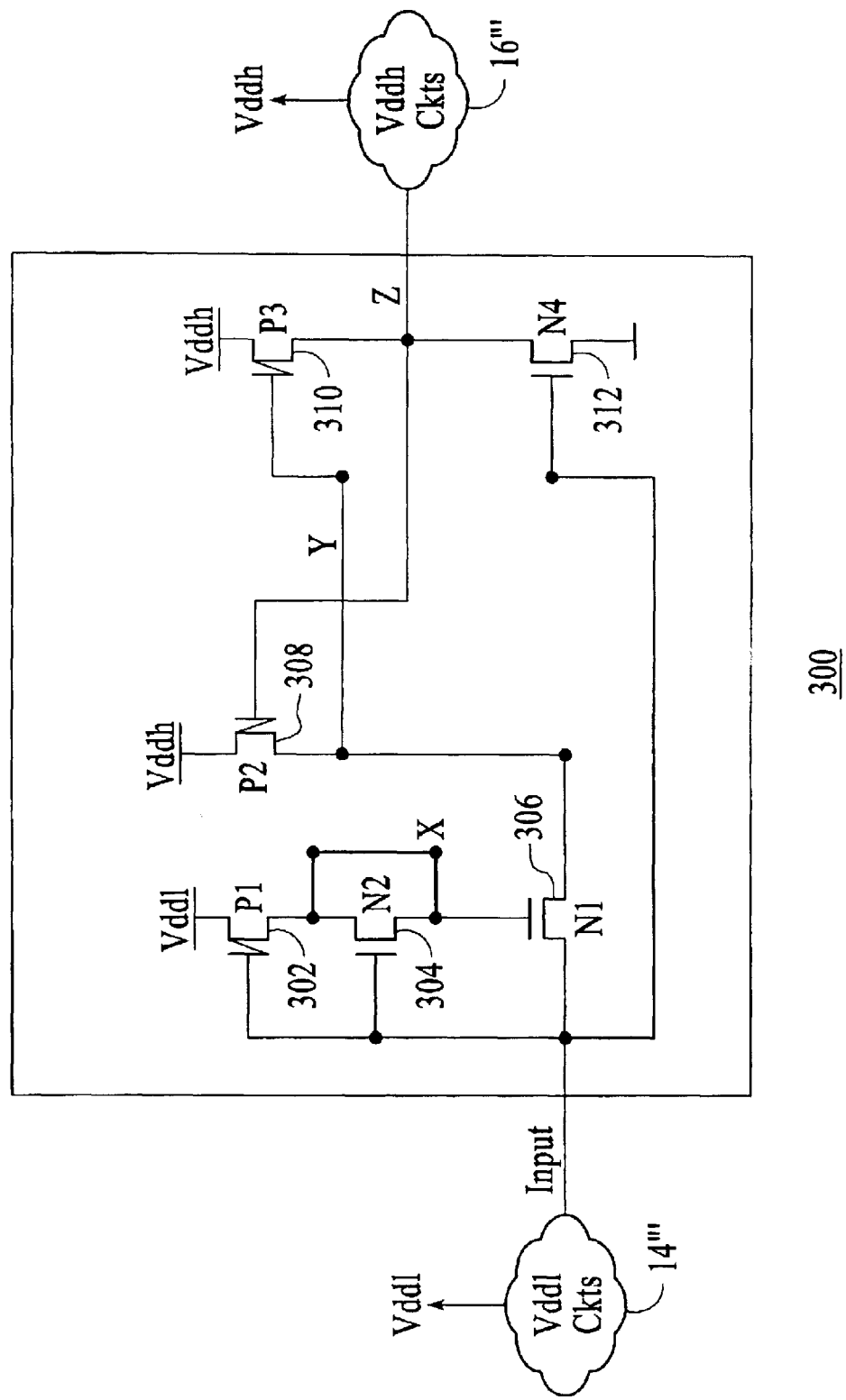
FIG. 4 illustrates a first embodiment of a level translator circuit in accordance with the present invention.

FIG. 4 illustrates a first embodiment of a level translator circuit 300 in accordance with the present invention. In this level translator configuration, node-Y is isolated from the input node via an nfet pass transistor 306, whose gate is bootstrapped coupled through nfet transistor 304. Pfet transistor 302 provides a Vddl potential to node-X when the input is a "0" allowing nfet transistor 306 to conduct, thereby propagating the "0" to node-Y. A "0" on node-Y deactivates nfet transistor 312 and allows pfet transistor 310 to conduct raising the output to a Vddh potential. The Vddh potential on node-Z deactivates pfet transistor 308 and ensures no leakage between Vddh and the input. When the input transitions from "0" to high (Vddl), pfet transistor 302 stops conducting, allowing node-X to be bootstrapped above the Vddl supply through the capacitor configured nfet transistor 304.

Node-X can achieve the lower of (Vddl+Vtn) or (Vddl+Vtp) potential before pfet transistor 302 begins to conduct and limits the bootstrapped potential from going any higher. Since node-X is now at Vddl+Vtn, the full input voltage Vddl is transferred to node-Y. This causes nfet transistor 312 to begin conducting more vigorously and reduces the conduction of pfet transistor 310, allowing the output node-Z to begin to fall towards "0", which in turn causes pfet transistor 308 to begin to conduct raising the node-Y potential to Vddh.

When node-Y reaches Vddh, device pfet transistor 310 is completely off, eliminating any short-circuit current through nfet transistor 312. Nfet transistor 306 isolates node-Y from the input. Now, should the voltage on node-X be close to or higher than the Vddl (the input bias) plus Vt of nfet transistor 306, some conduction between node-Y will take place. A means to eliminate this possible conduction will be disclosed later. There are two possible connection configurations for the gate of nfet transistor 312. One connects the gate of nfet transistor 312 to the input, while the other connects the gate of nfet transistor 312 to the gate of pfet transistor 310. Either one of these connections will result in a level translation, but only one connection can be made. That is, they are mutually exclusive.

The advantage of connecting the gate of nfet transistor 312 to the input lies in the fact that the output stage begins to switch both on and off sooner. For the case when the input is "0" and is rising to a "1", nfet transistor 312 activates immediately, which results in the output beginning to fall sooner. This advantage results in higher short-circuit current in the output stage since the pfet transistor 310 is still active, but the duration of the current spike is reduced. The maximum voltage that the gate of the nfet transistor will attain is Vddl. Hence, the power associated with charging and discharging the nfet transistor 312 gate node is less than if the other connection were made, since the maximum gate voltage would be Vddl rather than Vddh.

For the other transition, input falling from a "I" to a "0", the nfet transistor 312 of the output stack would discharge more rapidly, and before the pfet transistor 310 could 7' activate, thereby eliminating any short-circuit current resulting in lower power and higher performance.

Figure 5:
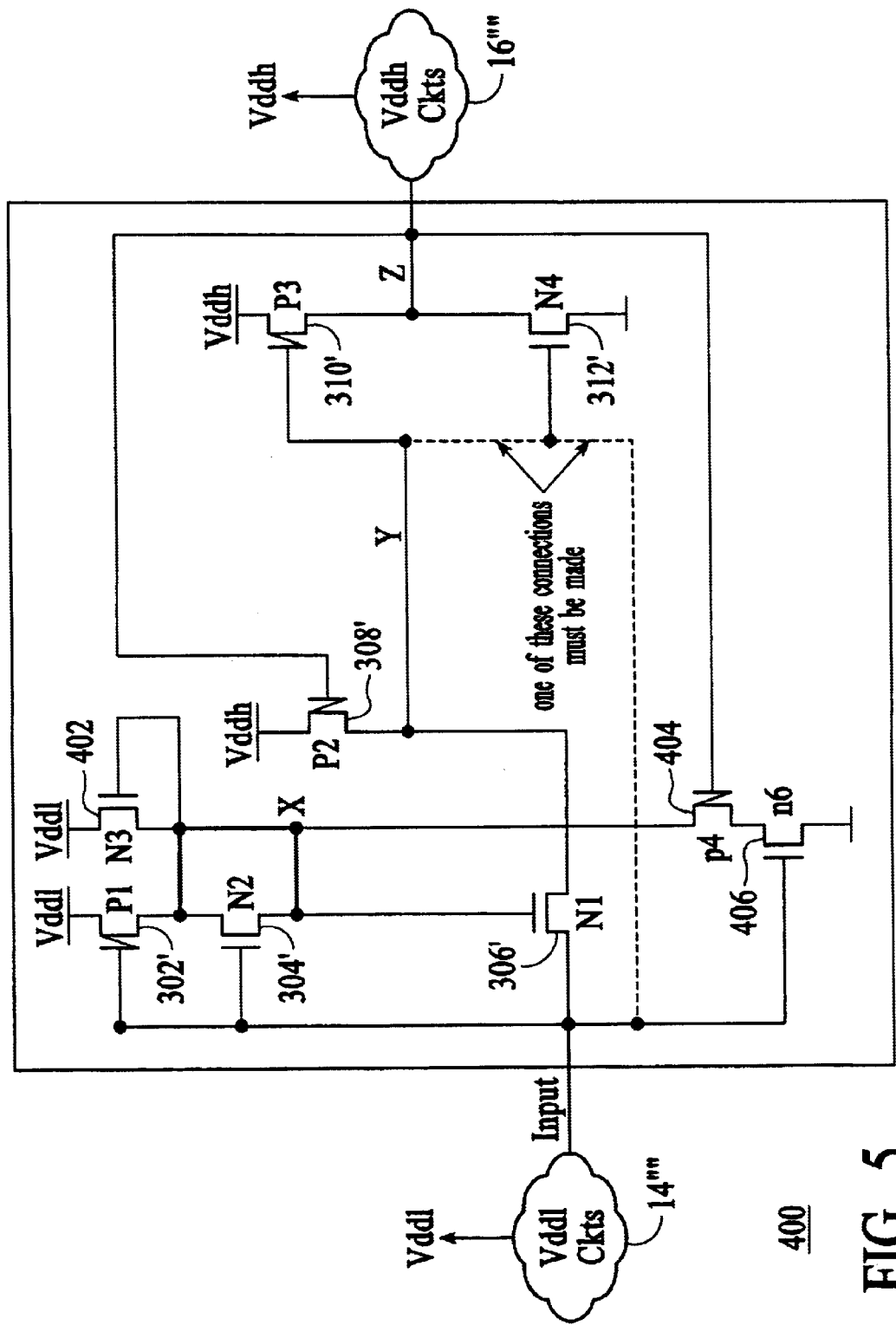
FIG. 5 illustrates a second embodiment of a level translator circuit in accordance with the present invention.

FIG. 5 illustrates a second embodiment of a level translator circuit 400 in accordance with the present invention. Components common to circuit 300 have the same reference numerals. Transistor 402 is used to ensure Vt tracking of transistor 306' and as such may be deemed optional. In addition, a very, very small pfet transistor and nfet transistor stack (pfet transistor 404 and nfet transistor 406) can be added between node-X and ground whose gates are connected to Node-Z, and the input, respectively, will remove any excess charge on Node-X and ensure isolation. The stack is used to clamp node-X to |Vtp| when Vin is a "1" and the output has reached a steady state value of "0". This will completely eliminate any unwanted leakage power.

Figure 1:
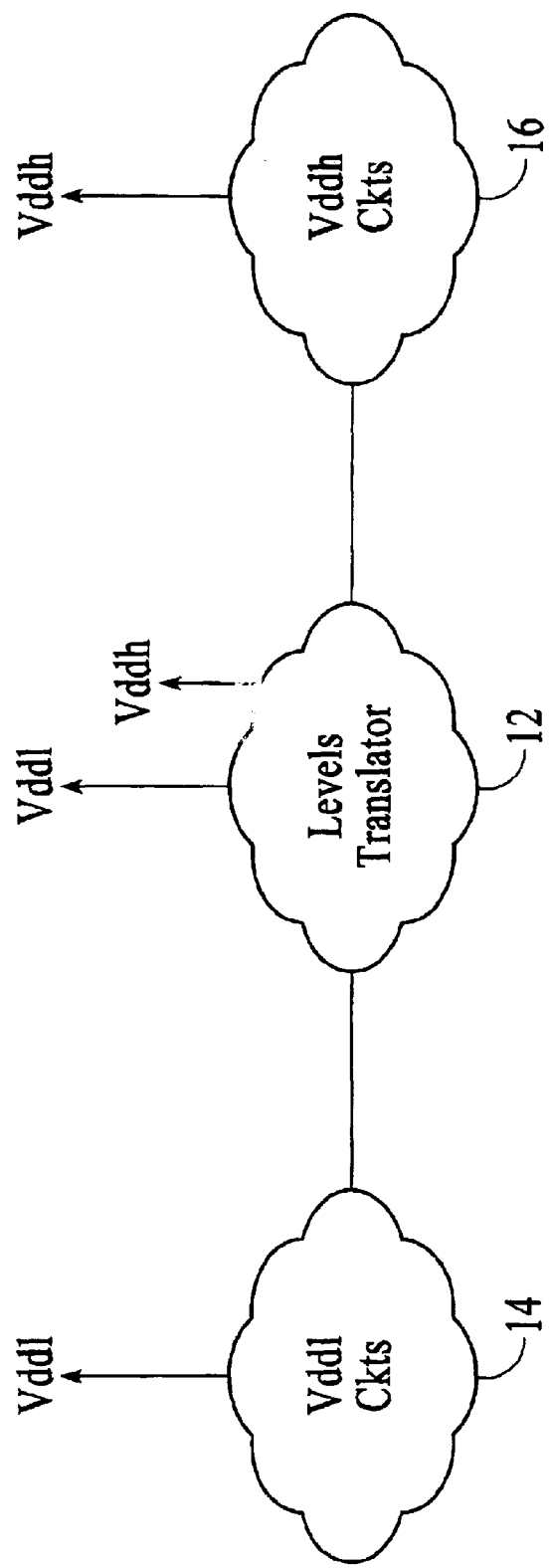
FIG. 1 is a simple block diagram of a level translator system.
Figure 2:
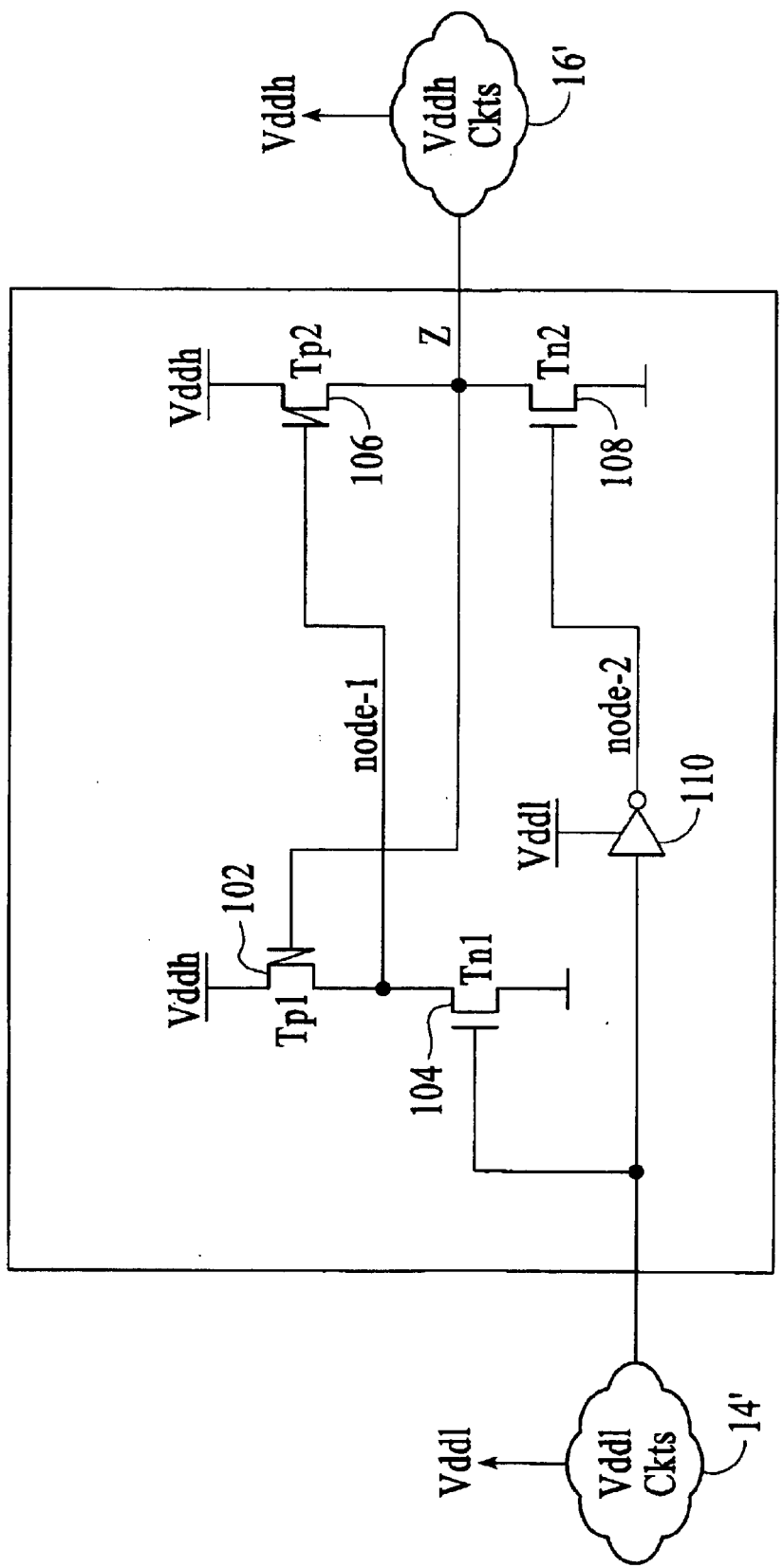
FIG. 2 illustrates a first embodiment of a conventional level translator circuit coupled between distinct power supplies.
Figure 3:
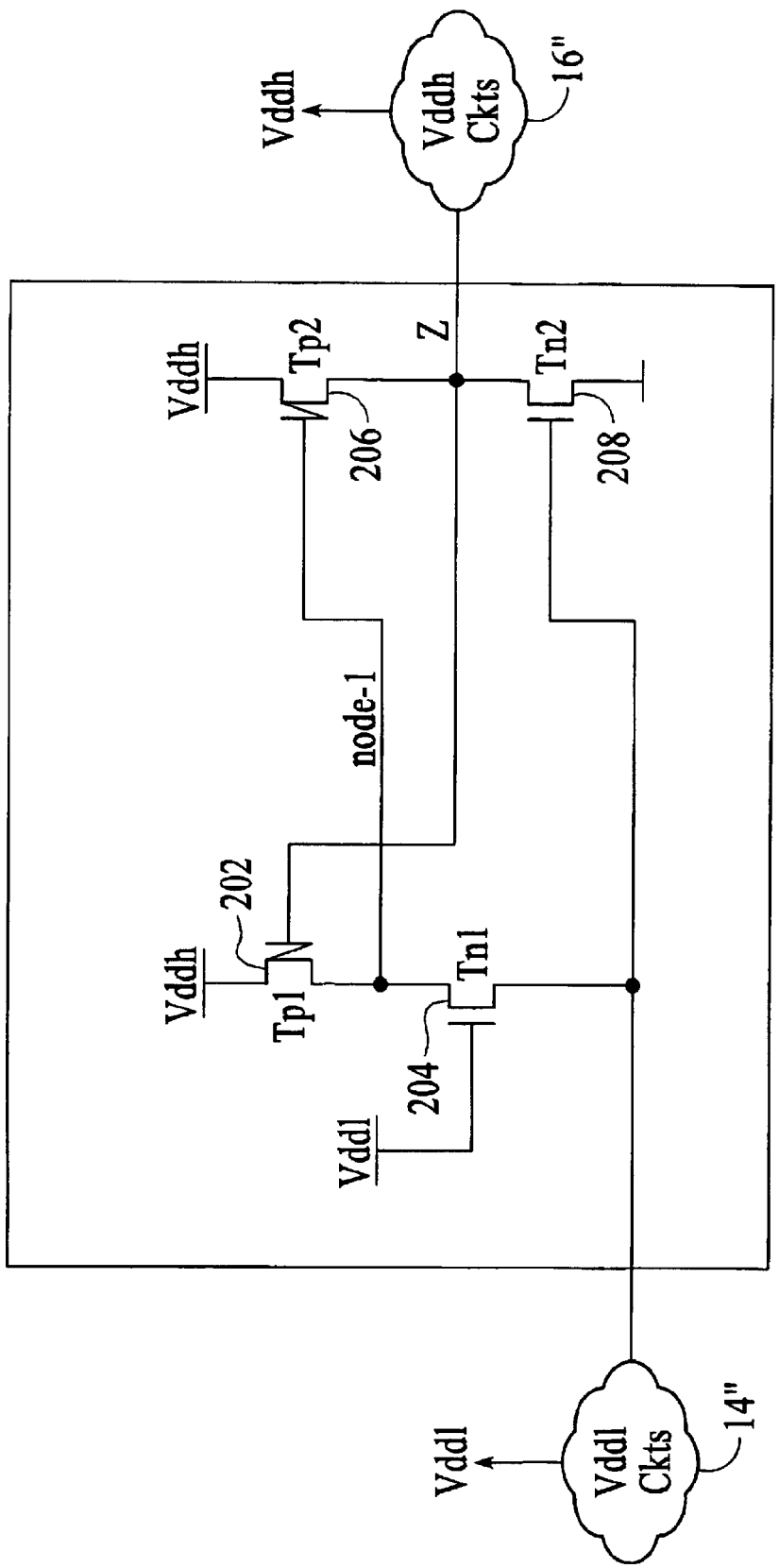
FIG. 3 illustrates a second embodiment of a conventional level translator circuit coupled between distinct power supplies.

The drawback of this configuration is that active power will be dissipated transiently as the node-X potential is reduced from Vddl or Vddl+|Vtp| down to |Vtp| and the performance of the circuit when the input is transitioning from "1" to "0" will also be compromised, as we must wait for node-X to rise. This configuration results in an inverting level translation like that of the circuit illustrated in FIG. 3.

The optional devices (nfet transistor 402, pfet transistor 404 and nfet transistor 406) can be eliminated if the voltage on node-X is held in check by the threshold voltage of pfet transistor 302'. The threshold voltage of pass nfet transistor 306' should be higher than that of optional nfet transistor 406, due to the body effect on nfet transistor 306'. A superior solution is illustrated in FIG. 6.

Figure 6:
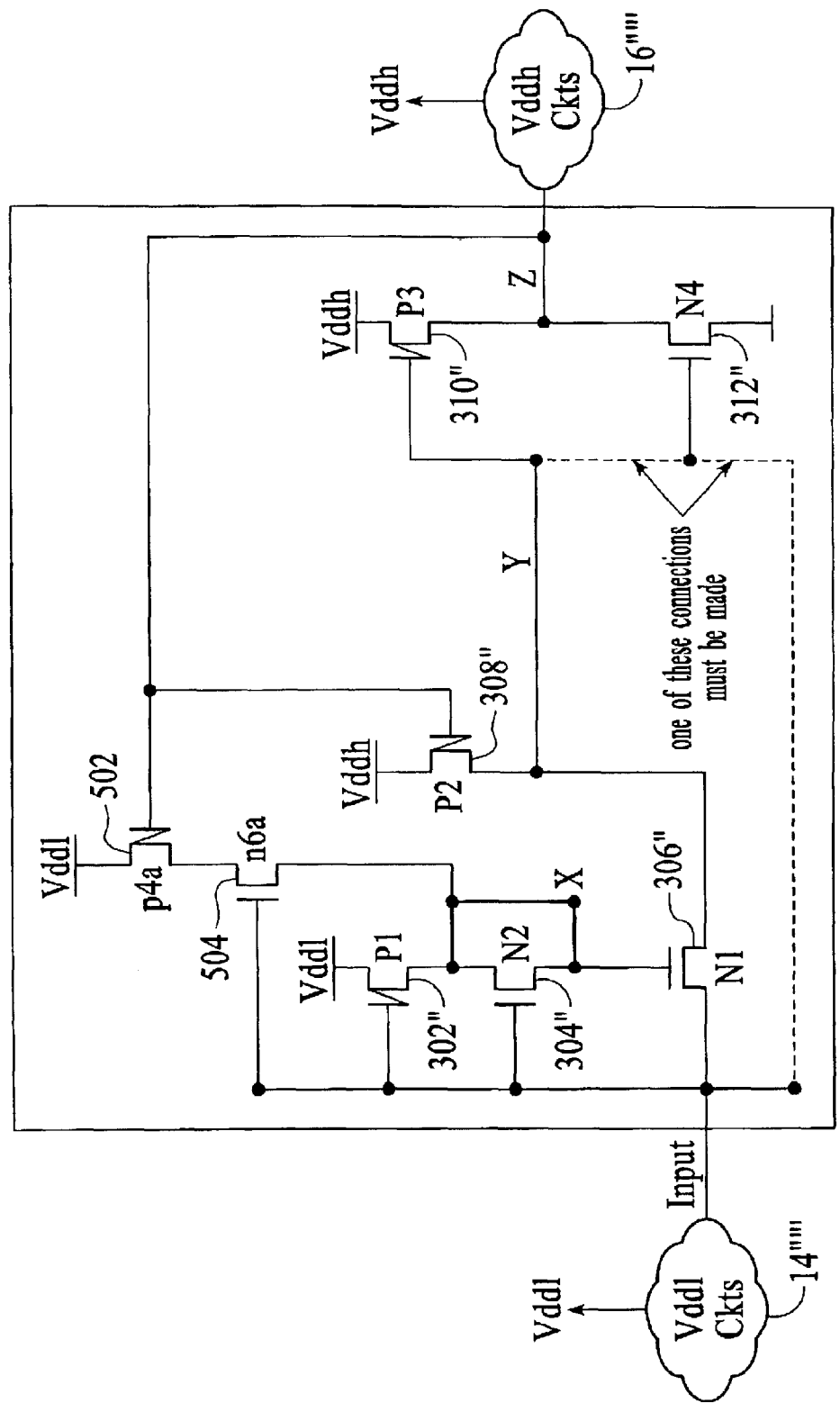
FIG. 6 illustrates a third embodiment of a level translator circuit in accordance with the present invention.

FIG. 6 illustrates a third embodiment 500 of a level translator circuit in accordance with the present invention. In FIG. 6, a stacked device configuration of pfet transistor 502 and nfet transistor 504 are connected between the Vddl supply and node-X. The gate of nfet transistor 504 is connected to the input, and the gate of pfet transistor 502 is connected to the output Z. The stack is very similar to that which was illustrated in FIG. 4, in that, the gates of the devices are controlled in the same manner. The difference is that the stack is now connected between Vddl and node-X, rather than between ground and node-X. Also, the order of the devices in the stack has been swapped with nfet transistor 504 now connected to node-X. The operation is as follows: For an input at "0", pfet transistor 302" is active, which forces node-X to Vddl volts. This allows nfet transistor 306" to conduct and propagate the input "0" to node-Y. Node-Y at "0" deactivates nfet transistor 312" and activates pfet transistor 310" allowing the output to attain a "1". The "1" on the output keeps pfet transistor 308" and pfet transistor 502 off. The input at "0" keeps nfet transistor 504 off as well. There are two possible connection configurations for the gate of nfet transistor 312". One connects the gate of nfet transistor 312" to the input, while the other connects the gate of nfet transistor 312" to the gate of pfet transistor 310". Either one of these connections will result in a level translation, but only one connection can be made.

That is, they are mutually exclusive.

Now as the input transitions from a "0" to a "1", pfet transistor 302" is deactivated while nfet transistor 504 activates. Node-X is essentially in a dynamic mode, initially allowing nfet transistor 304" to capacitively couple the input to node-X, effectively bootstrapping the node above Vddl. The maximum voltage that node-X can achieve in steady state is Vddl+|Vtp| due to the presence of pfet 302". Nfet transistor 306" conducts more vigorously when the higher bias is applied to node-X, allowing node-Y to achieve Vddl potential more rapidly, thereby reducing the conduction of pfet transistor 310". Nfet transistor 312" will respond to the input rising to Vddl regardless of which connection is made, but for the purposes of this discussion it is assumed that the gate of nfet transistor 312" is connected to the input. Since nfet transistor 312" is on the output, Z will be moving toward ground.

As the output falls from Vddh toward ground, pfet transistor 308" begins to conduct and causes node-Y to rise to Vddh, which in turn causes pfet transistor 310" to stop conducting and allows the output to achieve a full ground potential. As node-Z is falling toward ground, it causes pfet transistor 502 to conduct, thereby clamping node-X to Vddl-|Vtn|. This potential will ensure that there is no leakage across nfet transistor 306". Steady state has been achieved. From this steady state condition, if the input were to change from a "1" to a "0", node-X, which was held at Vddl-|Vtn|, would rise to Vddl through the conduction of pfet transistor 302".

The bootstrap capacitor will now attempt to couple node-X downward, but pfet transistor 302" will resist the action. With pfet transistor's 306" gate at a sufficiently high potential, node-Y will begin to discharge to ground. Nfet transistor 312" would have shut off upon arrival of the input signal, thereby allowing node-Z to 'float'. Pfet transistor 308" is still active as the node-Z potential has not risen yet until node-Y forces conduction of pfet 310". Pfet transistor 308" continues to resist node-Y from falling to "0" until the output has reached a sufficiently high voltage, and as such, its size must be very small. As the system stabilizes, the output attains a "1". Node-X is held at Vddl volts. This configuration of devices yields very good overall performance, very low power, and eliminates any steady state dynamic nodes in the translator circuit 500.

A level translator circuit in accordance with the present invention utilizes a bootstrap mechanism in the gate of the input transistor to allow translating between a low voltage potential to a high voltage potential to be performed more efficiently.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A level translator circuit for use between a lower voltage potential circuit and a higher voltage potential circuit; the translator circuit comprising:

first transistor coupled to the lower voltage potential circuit;

a bootstrap mechanism coupled to the first transistor;

a second transistor coupled to the first transistor, a higher voltage potential and the higher voltage potential circuit;

a third transistor coupled to the higher voltage potential circuit, the higher voltage potential and the second transistor; and a fourth transistor coupled to the higher voltage potential circuit, and to a ground potential, wherein the bootstrap mechanism allows for the dynamic modulation of the first transistor to maximize translation speed and minimize power consumption;

wherein the bootstrap mechanism comprises:

a fifth transistor coupled to a lower voltage potential and the lower voltage potential circuit; and a capacitative mechanism coupled to the lower voltage potential circuit and to the gate of the first transistor; and wherein the level translator circuit further comprises:

a sixth transistor coupled to the bootstrap mechanism, and a transistor stack coupled to the bootstrap mechanism, the higher voltage potential circuit, and the lower voltage potential circuit, and the ground potential.

2. The level translator circuit of claim 1 wherein the first and fourth transistors comprise nfet transistors and the second and third transistors comprise pfet transistors.

3. The level translator circuit of claim 1 wherein the fifth transistor comprises a pfet transistor and the capacitive mechanism comprises an nfet transistor whose drain and source is shorted.

4. The level translator circuit of claim 1 wherein the gate of the third transistor is coupled to the gate of fourth transistor.

5. The level translator circuit of claim 1 wherein the gate of the fourth transistor is coupled to the lower voltage potential circuit.

* * * * *